United States Patent
Meaney et al.

(10) Patent No.: US 8,914,708 B2
(45) Date of Patent: Dec. 16, 2014

(54) BAD WORDLINE/ARRAY DETECTION IN MEMORY

(75) Inventors: Patrick J. Meaney, Poughkeepsie, NY (US); Arthur J. O'Neill, Poughkeepsie, NY (US); Gary E. Strait, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 13/523,971

(22) Filed: Jun. 15, 2012

(65) Prior Publication Data

US 2013/0339822 A1 Dec. 19, 2013

(51) Int. Cl.
  *G11C 29/00* (2006.01)
  *H03M 13/05* (2006.01)
  *G06F 11/07* (2006.01)
  *G06F 11/10* (2006.01)

(52) U.S. Cl.
  CPC ............. *H03M 13/05* (2013.01); *G06F 11/073* (2013.01); *G06F 11/1008* (2013.01)
  USPC .......................................... 714/766; 714/773

(58) Field of Classification Search
  None
  See application file for complete search history.

(56) References Cited

U.S. PATENT DOCUMENTS

| | | | |
|---|---|---|---|
| 5,631,915 A | 5/1997 | Meaney et al. | |
| 5,657,469 A * | 8/1997 | Shimizu | 711/118 |
| 8,095,836 B2 | 1/2012 | Eguchi et al. | |
| 8,117,521 B2 * | 2/2012 | Parker et al. | 714/785 |
| 8,397,130 B2 * | 3/2013 | Clark et al. | 714/763 |
| 8,402,326 B2 * | 3/2013 | Singh | 714/711 |
| 2009/0006923 A1 | 1/2009 | Gara et al. | |
| 2013/0080858 A1 * | 3/2013 | Lee et al. | 714/773 |
| 2013/0173970 A1 * | 7/2013 | Kleveland et al. | 714/710 |
| 2013/0246868 A1 * | 9/2013 | Takagi | 714/719 |
| 2013/0339808 A1 * | 12/2013 | Ambroladze et al. | 714/54 |
| 2013/0339823 A1 * | 12/2013 | Meaney et al. | 714/773 |

FOREIGN PATENT DOCUMENTS

WO 2012005993 A1 1/2012

* cited by examiner

*Primary Examiner* — Daniel McMahon
(74) *Attorney, Agent, or Firm* — Cantor Colburn LLP; Margaret McNamara

(57) ABSTRACT

A technique for error detection is provided. A controller is configured to detect errors by using error correcting code (ECC), and a cache includes independent ECC words for storing data. The controller detects the errors in the ECC words for a wordline that is read. The controller detects a first error in a first ECC word on the wordline and a second error in a second ECC word on the wordline. The controller determines that the wordline is a failing wordline based on detecting the first error in the first ECC word and the second error in the second ECC word.

11 Claims, 9 Drawing Sheets

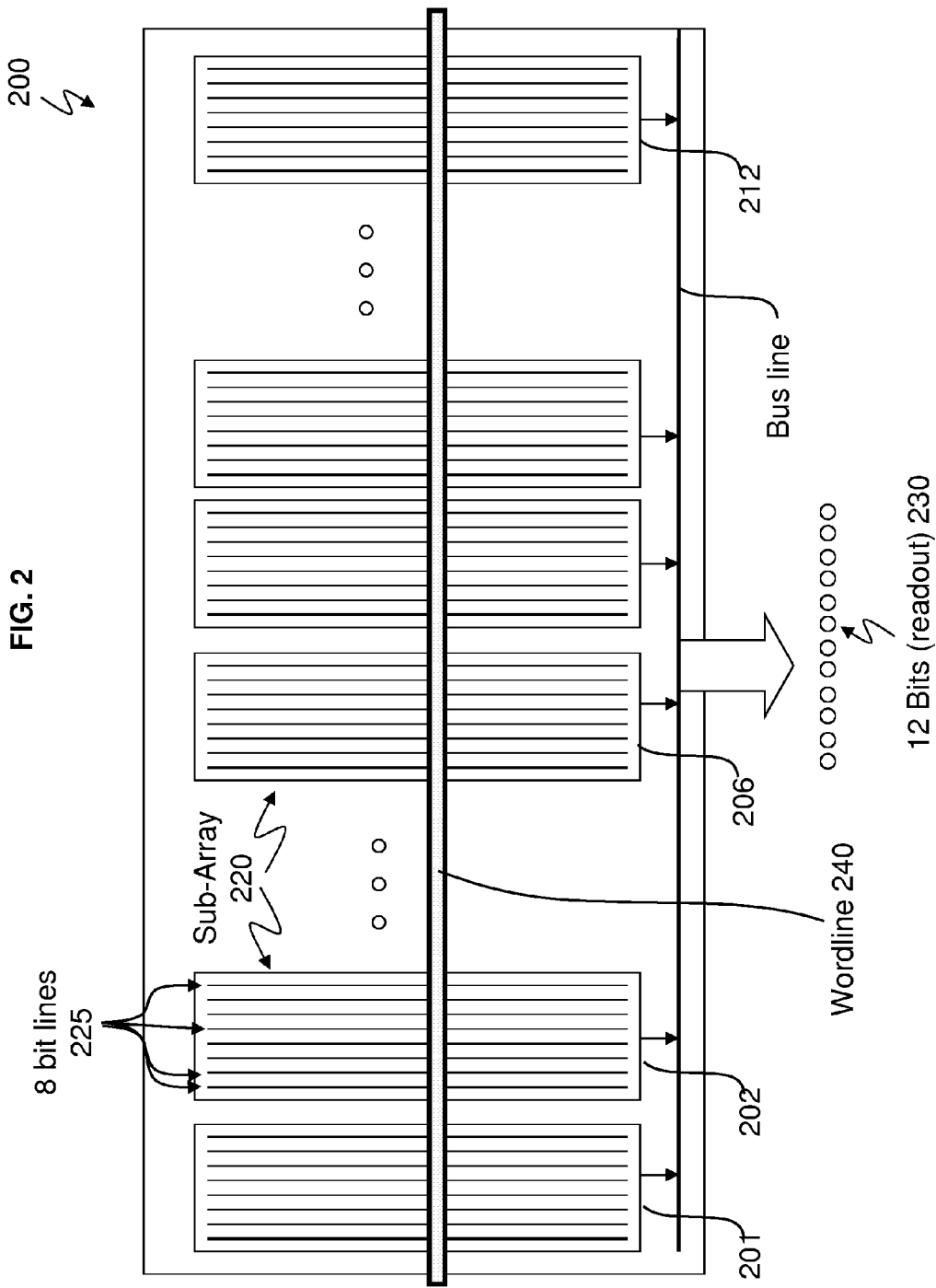

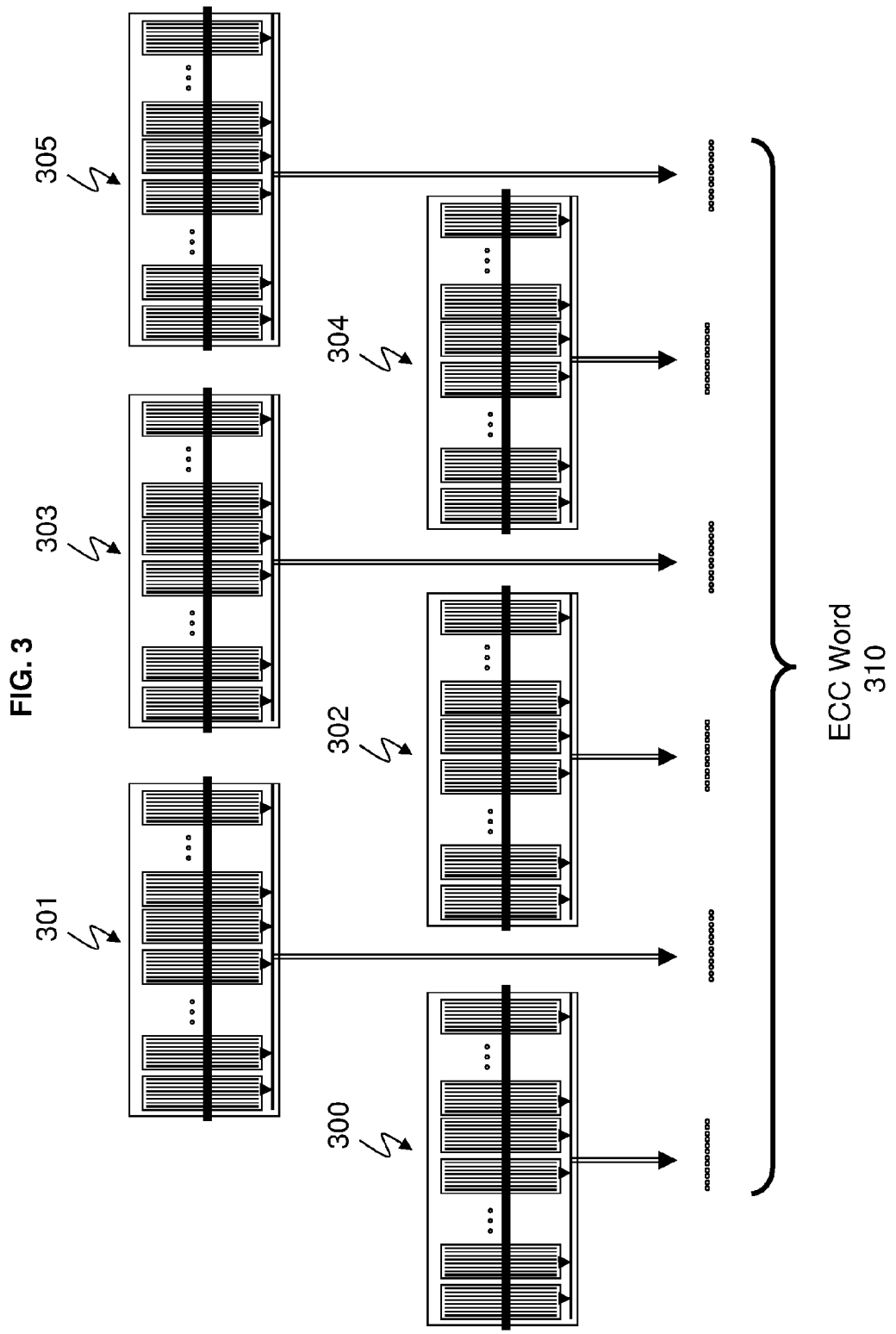

FIG. 4

| Number Of ECC Words (groups) Checked | Mis-correct Rate | | Notes |
|---|---|---|---|
| | Simple "OR" (of the UE cases) | (Checker 70) Assume: Any UE triggers checker Any CE + CE triggers checker Checker protects all groups | |
| 1 | 28% | 28% | Single Group – no impact. |
| 2 | 8.1% | 0.22% | Multiple real CEs in different groups is deemed unlikely and more probably a severe problem causing lots of data corruption. |
| 3 | 2.3% | 0.0013% | This number is better than 8 separate groups of simple UE ORing. |
| 4 | 0.66% | 0.000067% | |
| 5 | 0.19% | 0.00000033% | |
| 6 | 0.054% | 0.0000000015% | |
| 7 | 0.015% | 0.00000000000070% | |
| 8 | 0.0044% | 0.0000000000000031% | |

FIG. 5

| Detected on ECC Word (group) #1 - Current Group being checked | Clean | CE | UE |
|---|---|---|---|
| Detected on ECC (group) #2 - Checking on Complement Group | | | |
| Clean | Clean | CE | UE |
| CE | CE | UE | UE |
| UE | UE | UE | UE |

BAD WORDLINE/ARRAY DETECTION IN MEMORY

BACKGROUND

The present invention relates generally to error detection, and more specifically, to a detection of a bad wordline and/or bad array in memory.

A cache (i.e., memory) is a component that transparently retains data elements (or simply data) so that future requests for any retained data can be served faster. A data element that is stored within a cache corresponds to a pre-defined storage location within a computer system. Such data element might be a value that has recently been computed or a duplicate copy of the same storage location that are also stored elsewhere. If requested data is contained in the cache, this is a cache hit, and this request can be served by simply reading the cache, which is comparatively faster since the cache is usually built close to its requester. Otherwise, if the data is not contained in the cache, this is a cache miss, and the data has to be fetched from a storage system medium not necessarily close to the requester, and thus is comparatively slower.

In a cache, electrical or magnetic interference inside a computer system can cause a single bit of dynamic random access memory (DRAM) to spontaneously flip to the opposite state. This can change the content of one or more memory cells or interfere with the circuitry used to read/write them. Also, the circuitry of the cache may fail, and this can change the content of one or more memory cells.

To ensure the integrity of data stored in a data processing system and transmitted between various parts of the system, various error detection and correction schemes have been employed. An error can be a correctable error (CE) or an uncorrectable error (UE). Schemes, such as the Hamming code, allow for double error detection and single error correction. Typically, before a data word is stored in memory, check bits are generated over the data bits and stored with the data word. When the data word is retrieved from memory, a check is made over the data and the check bits to detect, and if necessary, to correct identifiable bits. In checking the data word and error bits received from memory, a syndrome is generated for each parity group of a multiple byte data word. A matrix, referred to as an H-matrix, may be generated which defines all of the syndromes for which a single error is correctable and which identifies each bit position of the data word which is correctable. When a syndrome is generated which matches the data in one of the columns of the matrix, the bit to be corrected is identified from the matrix and the polarity of the identified bit is changed to correct the data error. Additional tests need to be made to determine whether there are uncorrectable errors. When dealing with 64-bit data words, the H-matrix has 64 columns, plus columns for check bits. The number of syndromes which may be generated and which do not fall within the matrix are considerably larger than the correctable-error syndromes included in the matrix. A typical error correction scheme using 8-bit syndromes for 64 bits of data, and requiring single error correction and double error detection, will have 256 possible syndromes and 72 syndromes associated with correctable errors. The detection of the presence of a correctable error and the presence of uncorrectable errors requires large amounts of detection circuitry.

SUMMARY

Embodiments include a system, and computer program product for error detection. Multiple error correcting code (ECC) words of an individual wordline are read from the cache. The wordline includes two or more ECC words which are read. The controller detects a first error in a first ECC word and a second error in a second ECC word in the wordline that is read. The controller identifies the wordline as a failing wordline based on detecting the first error in the first ECC word and the second error in the second ECC word.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

FIG. 2 depicts an array macro of memory elements/cells in accordance with an embodiment;

FIG. 3 depicts a group of arrays accessed simultaneously to provide a complete word of data to the error correcting logic according to an embodiment;

FIG. 4 depicts a table comparing mis-correct probabilities in accordance with an embodiment;

FIG. 5 depicts a table for detecting a wordline failure in accordance with an embodiment;

DETAILED DESCRIPTION

Figure 1:
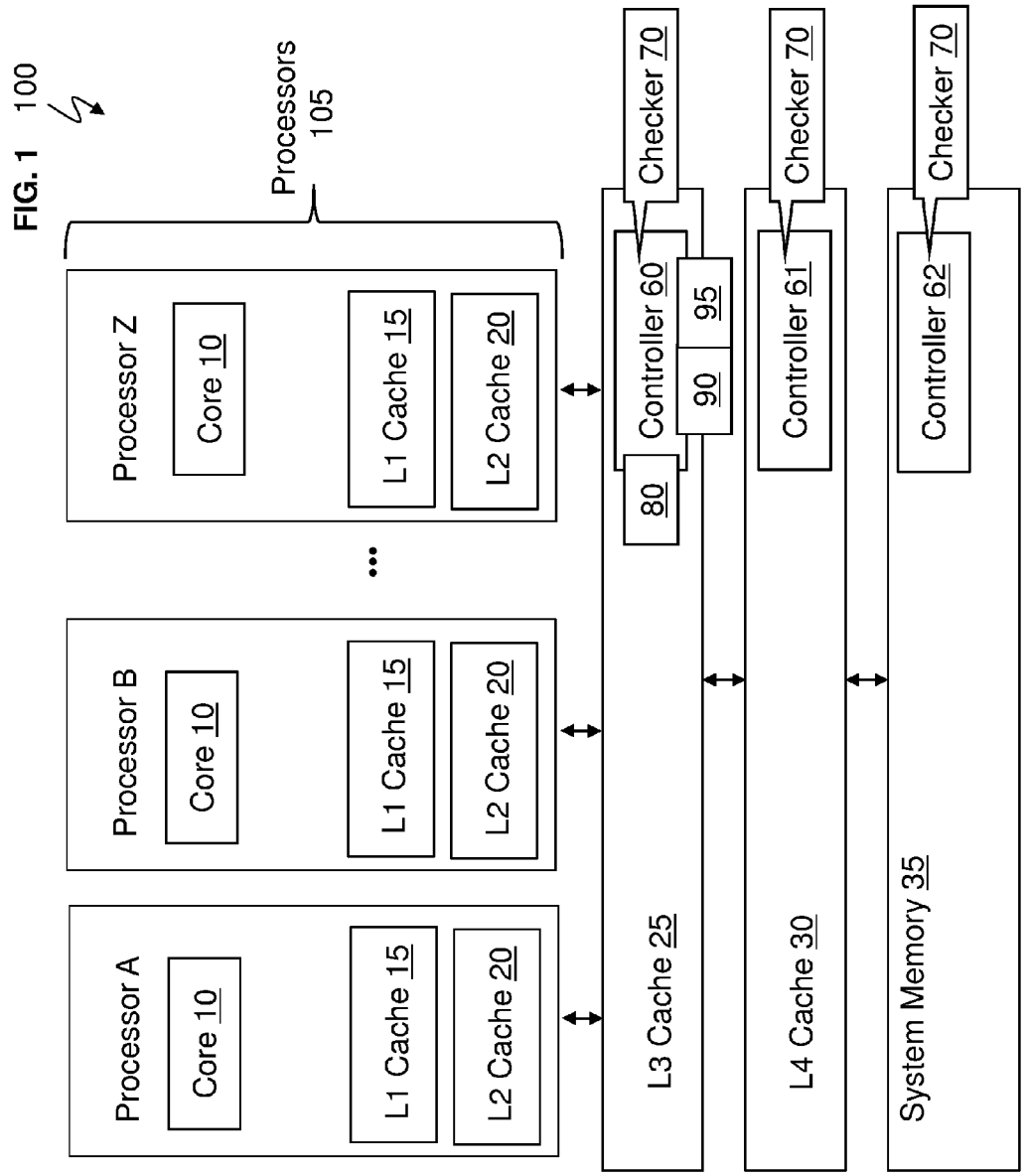
FIG. 1 depicts a block diagram of a computer system in accordance with an embodiment.

An embodiment discloses a controller for detecting errors by utilizing error correcting code (ECC). When a wordline is read, the controller can detect errors in the respective ECC words. The controller determines a wordline failure when more than one error (of any type) is detected for the wordline.

Random access memory (RAM) is a form of computer data storage that may be utilized in caches. As technologies become more dense, reliability defects in SRAMs (static random access memory), EDRAMs (embedded dynamic random access memory), DRAM (dynamic random access memory), and Regfiles (register files) are becoming more likely. These can affect implementations for storage, memory, and cache. While most cache designs have ECC (error correcting code) protection to detect and correct some types of errors (like bitline and single-cell errors), wordline errors may or may not be detected with high probability. There are also forms of subarray or array errors that can also go undetected or be mis-corrected as a correctable error, when, in fact, the data is unusable and uncorrectable.

For instance, in an ECC word with SEC/DED or SECDED (Single Error Correct, Double Error Detect), single bit errors are corrected with 100% probability while double-bit errors are detected (but not corrected) with 100% probability. Once three or more bits fail, the ECC may flag uncorrectable errors (UEs) but there are also probabilities of mis-corrected data (false CEs). For a 72/64 ECC SEC/DED Hamming Code, this probability of a mis-correct on a random hit of many bits (e.g., >=3) is approximately 29%. Typically, this percentage is acceptable when errors have geometrically or exponentially decreasing probabilities for failure (e.g. probability, p, of a single bit in error and probability of $p^2$ for two random errors, $p^3$ for 3 random errors, etc.). For most server systems, if a gross error causes many bits to fail at once, a 29% mis-correct rate is unacceptable.

In an embodiment, a cache controller (e.g., circuit) makes use of checking multiple ECC words accessed with the same wordline (or subarray or other common regions of logic or arrays) to detect gross errors with a higher degree of detection. This, in turn, is used to protect the data (through a UE indicator, a system checkstop or other means, depending on the needs of the system).

In the present disclosure, some of this checking on multiple ECC words (groups) comes relatively cheaply. For instance, on a cache design, often data is fetched in multiple shots (e.g., blocks) of data from a host of array macros. Data can be organized in a cache to take advantage of multiple checking, for instance, by ensuring that multiple words of data are fetched from the same components rather than distributed across many components. This allows, in a very brief one or two cycle window, for data to be fetched and checked from multiple ECC groups at a time.

To prevent the standard volume of ECC words and probabilities of false errors from going undetected, the use of restricted "CE" or a "UE" information from multiple ECC groups is favored over a more lax "ORing" (logical "or" statements/evaluations) of just the UE cases. The restriction of only allowing a single correctable error in one ECC group is much more effective as discussed herein according to an embodiment. The calculations (for example) are shown in FIGS. 4 and 5.

Turning now to FIG. 1, a block diagram of a computer system 100 is generally shown according to an embodiment. The computer system 100 includes one or more processors 105 (i.e., central processing units) such as processor A through processor Z. The processors 105 may each have one or more processor cores 10 (e.g., single core, dual core, quad core, etc.), and the processor cores 10 may be referred to as circuitry.

The processors 105 may each include (on chip) a level one (L1) cache 15 and a level two (L2) cache 20. The L1 cache 15 and L2 cache 20 may be on-processor (hardware) memory for caching (i.e., retaining) data on the processor 105. The processors 105 may be operatively connected to a level three (L3) cache 25 which is operatively connected to a level four (L4) cache 30.

Data retrieved from system memory 35 may be cached in any of the caches (e.g., in the L1 cache 15, L2 cache 20, L3 cache 25, and/or L4 cache 30). Typically, the L3 cache 25 and L4 cache 30 are larger than the on-processor L1 cache 15 and L2 cache 20.

Each of the memory storages such as the L1 cache 15, L2 cache 20, L3 cache 25, L4 cache 30, and system memory 35 may include a memory controller. For example, L3 cache 25 may include (cache) controller 60, L4 cache 30 may include (cache) controller 61, and system memory 35 may include (memory) controller 62.

FIG. 2 illustrates an example of an array macro 200 of memory elements/cells in accordance with an embodiment. The array macro 200 of memory elements includes numerous circuits for storing data as understood by one skilled in the art. The L1 cache 15, L2 cache 20, L3 cache 25, L4 cache 30, and/or system memory 35 may be represented by the array macro 200 of memory elements.

For ease of explanation and not limitation, reference is made to the L3 cache 25 for example scenarios below and it is contemplated that the various explanations analogously apply to any memory (resource) such as the L1 cache 15, L2 cache 20, L4 cache 30, and system memory 35.

For example purposes, the array macro 200 shows 12 concurrently accessed data bits 230 which are also referred to as an array word (i.e. a word or group of bits coming out of one array). The 12 bits are associated with an address region known as being part of a group, a compartment, and/or a set. Each subarray 220 is shown with 8 bit lines 225. The bit lines are shown as vertical lines in each subarray 220, with each read concurrently accessing one bit line 225 per subarray 220.

A wordline such as the wordline 240 is read (by the controller 60) across each of the 12 subarrays 220 (labeled as instances 201, 202 . . . , 206 . . . , and 212) to have, e.g., 12 bits read out 230. The 12 bits are shown as individual circles 230 in FIG. 2. Two different bitlines 225 connected to a common wordline 240 access two different bits (each bit is at the intersection of the wordline 240 and a bitline 225) which may be included in a common cache line or in two separate cache lines. In the state of the art, if a common wordline 240 failed and caused errors in two different cache lines, they were always checked independently, regardless of the use of the common failing wordline 240, allowing higher miscorrection rates. In the present disclosure, cache lines are identified which contain data from a common failing wordline 240.

FIG. 3 depicts a complete ECC word 310 being read from 6 arrays 300, 301, 302, 303, 304, and 305, each of which is an instance of the array 200. Each of the 6 arrays 300, 301, 302, 303, 304, and 305 supplies a 12 bit readout 230, together forming a complete 72 bit ECC word 310. The ECC checker 70 of, e.g., the controller 60 is configured to detect errors in the ECC word 310 comprising data from wordline 240 of the accessed arrays 300, 301, 302, 303, 304, and 305 by using error correcting code (check bits), for example a SEC/DED Hamming Code as understood by one skilled in the art. Additionally, the checker 70 incorporates checking that operates between multiple ECC words 310 read from other sets (bitlines 225) of the same wordline 240.

For example, the following cases are provided below in which the controller 60 (e.g., via checker 70) is configured to look for and detect the errors.

Case 1: A CE in one ECC word is treated as a CE when the other ECC words have zero syndrome (no mathematical error). On the other hand, the controller 60 is configured to treat two CEs (in two different ECC words 310 which are accessed using the same wordline, e.g., 240 or other element) as a wordline (or element) failure. This is because the ECC code is not intended to tolerate a wordline (element) failure in the checker 70 according to an embodiment. So, the mathematical probability of multiple ECC words (groups) 310 in a close time (proximity) and/or during a common access both having independent CEs is rare. Accordingly, the checker 70 in the controller 60 is configured to detect two CEs in two independent ECC words 310 from arrays 300, 301, 302, 303, 304, and 305 when different bitlines 225 of the same wordline 240 are accessed on successive reads. Therefore, the multiple CEs that are detected may be more likely random data which could be incorrect, uncorrectable data that happens to look like CEs, and the checker 70 is configured to detect this. The checker 70 in the controller 60 is configured to treat these two CEs for the two separate ECC words 310 read on the same wordline 240 as UEs. When the controller 60 detects the two CEs for the two separate ECC words 310 read on the same wordline 240, the controller 60 is configured to set a wordline flag 80 (wordline delete, and/or system checkstop) to protect the wordline 240 (as a wordline failure).

Case 2: The detection of a UE in any of the independent ECC words 310 that are from the same wordline 240 is used by the controller 60 to set the wordline flag 80 (wordline delete and/or system checkstop) to protect from a wordline failure. The term "wordline" can also indicate an element or component, such as a wordline, a submacro, a macro, a chip, etc.

Case 3: In an alternate embodiment, rather than treating any UE in any independent ECC word 310 as a condition to set a wordline flag 80, the detection of a UE in two different, independent ECC words 310 that are from the same wordline 240 is used by the controller 60 to set the wordline flag 80 (wordline delete and/or system checkstop) to protect from a wordline failure. The checker 70 can detect a UE in both ECC word 1 and ECC word 2, and the checker 70 in controller 60 is configured to set the wordline flag 80.

Case 4: In another embodiment, a CE in any independent ECC word 310 combined with a UE in any other independent ECC word 310 that are from the same wordline 240 are used as a condition to set a wordline flag 80. This condition exists whether the CE is detected first and then the UE or the UE is detected first and then the CE.

To prevent the standard volume of ECC words and probabilities of false errors from going undetected, the checker 70 in the controller 60 is configured to use (i.e., take into account) a CE and/or a UE in any two or more ECC words 310 (in a wordline, such as the wordline 240) which is more effective that ORing (logical "OR" statements/evaluations) the UE cases. Example calculations are shown in FIGS. 4 and 5.

FIG. 4 is a table 400 that shows the mis-correct probabilities for the simple "OR" of UE cases as compared to the checker 70 of the controller 60 according to an embodiment. This example uses 72/64 Hamming SEC/DED code coverage.

In the table 400, this is a scenario in which the checker 70 of the controller 60 reads out the wordline 240 of the ECC words 310. For the same wordline 240, the checker 70 in the controller 60 is configured with logical circuits to determine a bad wordline (and then set the wordline flag 80, e.g., to take that particular wordline offline 240) for any two or more independent ECC words 310 having the following cases:

One ECC word 310 with UE+another ECC word 310 with CE;

One ECC word 310 with CE+another ECC word 310 with CE;

One ECC word 310 with CE+another ECC word 310 with UE; and/or

One ECC word 310 with UE.

In an embodiment, the presence of any UE in any of the ECC words in a group can be considered as a condition to set wordline flag 80 in the controller 60, thus using a UE (two or more bits in error) to also detect a wordline failure.

Further, the table 400 shows the probabilities of mis-correcting a correctable error (CE) that should have been identified as an uncorrectable error (UE). The simple "OR" column 405 shows state of the art checking for 1-8 ECC words as possible in state of the art. State of the art systems do not have wordline detection as a design objective, but may in some cases be able to avoid wordline faults in large block data accesses, for example in a full cache line composed of multiple ECC words. In such cases, a complete cache line access of, for example, 256 bytes might make multiple accesses to the same array wordline to obtain all the data comprising the cache line. If the entire cache line was rejected due to a UE in any of the ECC wordlines, some coverage of undetected faults in other ECC words might be obtained due to rejection of an entire cache line due to a UE on any of the ECC words of the cache line. This "OR" of ECC results of each word 310, whereby a UE on any word of the cache line is handled as a fault on the entire cache line (all words of the cache line). This design may detect a single cache line error but not a wordline error. For instance, other cache lines on the wordline that do not have a detected UE will not be marked as a UE as containing data from a bad wordline.

However, the checker 70 column 410 shows error checking enhanced to improve wordline error detection as provided by the present disclosure, and how the mis-correct probabilities significantly decreases as each additional ECC word 310 is checked for an error and then compared to previously checked ECC words 310 in that wordline 240, such that any two separate ECC words 310 having an error (any type of error (CE and/or UE) is marked as a UE. The probabilities shown reflect a typical 72/64 Hamming code with a mis-correct only occurring for corrupted data that has every ECC word 310 syndrome indicating "all good" or a single ECC word 310 having a CE while all other ECC words 310 have a syndrome indicating an "all good" condition. In other words, any UE is treated as a wordline error and should feed the checker 70 in the controller 60.

In table 400, the checker 70 of the controller 60 is configured to assume (account) that all reads of the ECC words 310 (e.g., ECC word 1, ECC word 2, through ECC word 8 corresponding to bitlines 1 to 8 225 of a subarray 220) are in a close enough timeframe/proximity of one another. These 8 ECC words from the same array wordline 240 might all be read as part of a single cache line access of 32 ECC words, and completed in 8 clock cycles.

FIG. 5 is a table 500 showing an example of checking on the first ECC word 310 (which could be any in the ECC words 1-11) and then checking for errors on the next ECC word (which is another ECC word using the same array wordline 240) according to an embodiment. If there is ever a UE in any of the ECC words 310, the checker 70 of the controller 60 flags all the data words as uncorrectable. If only one ECC word 310 has a correctable error detected and all the other ECC words have an indication of clean data, the data is assumed to be a single bit error and is corrected in the ECC word 310 that had indicated a CE. The only way clean data is assumed and is not corrected is when all ECC words 310 in the group of ECC words indicate no errors.

Once the controller 60 detects the (two or more) errors on the same wordline 240 as discussed herein, the controller 60 may be configured to perform any combination (or all) of the following options (i.e., recovery sequence discussed below) to guard the bad wordline 240 from further use, thus protecting future data (that would have been stored on the bad wordline 240 but is, instead, routed to a different region of the cache).

Once the above special case conditions (CE/CE, CE/UE, UE/CE, and/or UE/UE) (with optional cases of (UE/good and good/UE) are detected by the controller 60 between at least two ECC words 310 on the same wordline 240, the controller 60 stores the failing wordline 240. Any future reference to that wordline, even if the wordline 240 looks clean or like a single CE, will be flagged as a UE by the controller 60. This requires the controller 60 to save the wordline address for future comparisons.

The controller 60 may be configured to perform and/or cause a dynamic (or static) repair of the bad wordline that has been detected.

The controller 60 may be configured to fence off a group of macros or wordlines (in the array macro 200) that have had one of these UEs detected. This could be dynamic or require a restart of the computer system 100.

Additionally, the controller 60 may perform and/or initiate calling home on such an event, such that the bad wordline 240 can be repaired (e.g., ticketed for repair).

Figure 6:
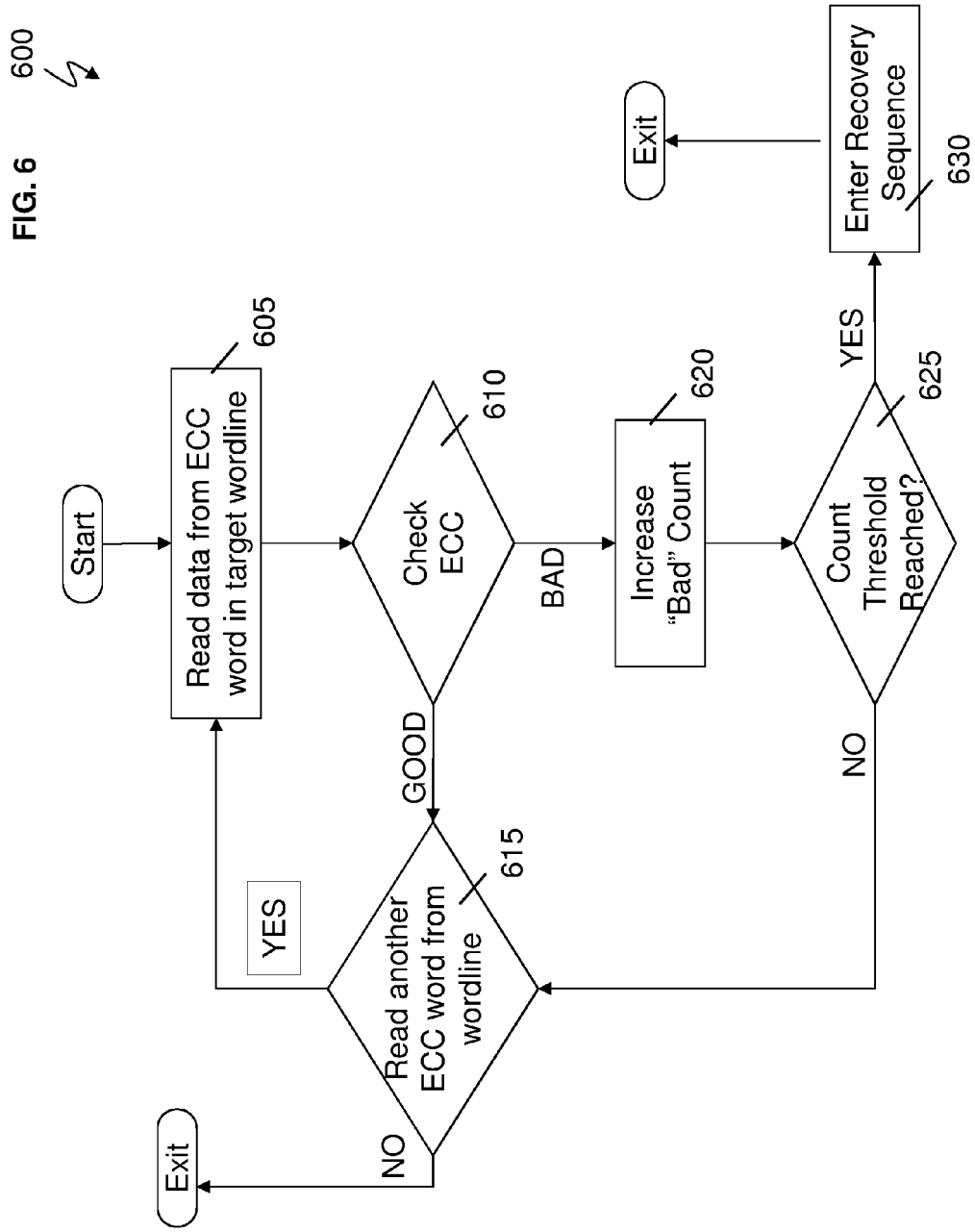
FIG. 6 depicts a flow chart of processing errors in accordance with an embodiment.

FIG. 6 is a flow chart of an example process 600 executed by the (e.g., the checker 70) controller 60 according to an embodiment. Reference can be made to FIGS. 1-5 and their corresponding discussions.

At block 605, the controller 60 is configured to read data from the target wordline (which in this case is the wordline 240). One skilled in the art understands that there are previous wordlines above the wordline 240 and subsequent wordlines below the wordline 240. The wordline 240 has been pointed out for explanation purposes, and the discussions apply to all wordlines as understood by one skilled in the art.

The controller 60 is configured to check the given ECC word 310 (on the target wordline) for errors at block 610. For example, the controller 60 executes error correcting code that checks the ECC bits for this ECC word 310 to determine whether there are any errors (e.g., CE, UE).

When no error is found in the data of the ECC word 310 (i.e., good status), the controller 60 is configured to read the next ECC word 310 on the target wordline 240 at block 615. This is so that the controller 60 can determine if the next ECC word 310 on the target wordline has an error. If there are no more ECC words 310 to be read for the target wordline 240, the process 600 exits for this wordline 240. For example, the controller 60 can move to the next target wordline to begin the process 600 again.

However, if there is another ECC word 310 on the target wordline 240 that has not been read, the controller 60 moves to block 605 to read data from the next ECC word 310.

Returning back to block 610, if the controller 60 determines that there is an error in the data read out of the ECC word 310 (i.e., bad status), the controller 60 is configured to increase a bad count 90 at block 620.

At block 625, the controller 60 determines whether a count threshold 95 has been reached by comparing the bad count 90 to the count threshold 95. The count threshold 95 stores the errors (UE and CE) found in the target wordline 240 when reading data out of the ECC word 1 through ECC word 8, or another number of ECC words deemed sufficient to detect wordline faults with sufficient reliability as detailed in column 410 of table 400. The count threshold 95 may be set at 2, which takes into account an error being found in one ECC word 310 and then another error being found in a second ECC word 310 on the same wordline 240. If the count threshold 95 has not been reached, the controller 60 moves to block 615. If the count threshold 95 has been reached, the controller 60 enters a recovery sequence at block 630 and then exits. The controller 60 marks the wordline 240 as a wordline failure via the bad wordline flag 80.

Figure 7:
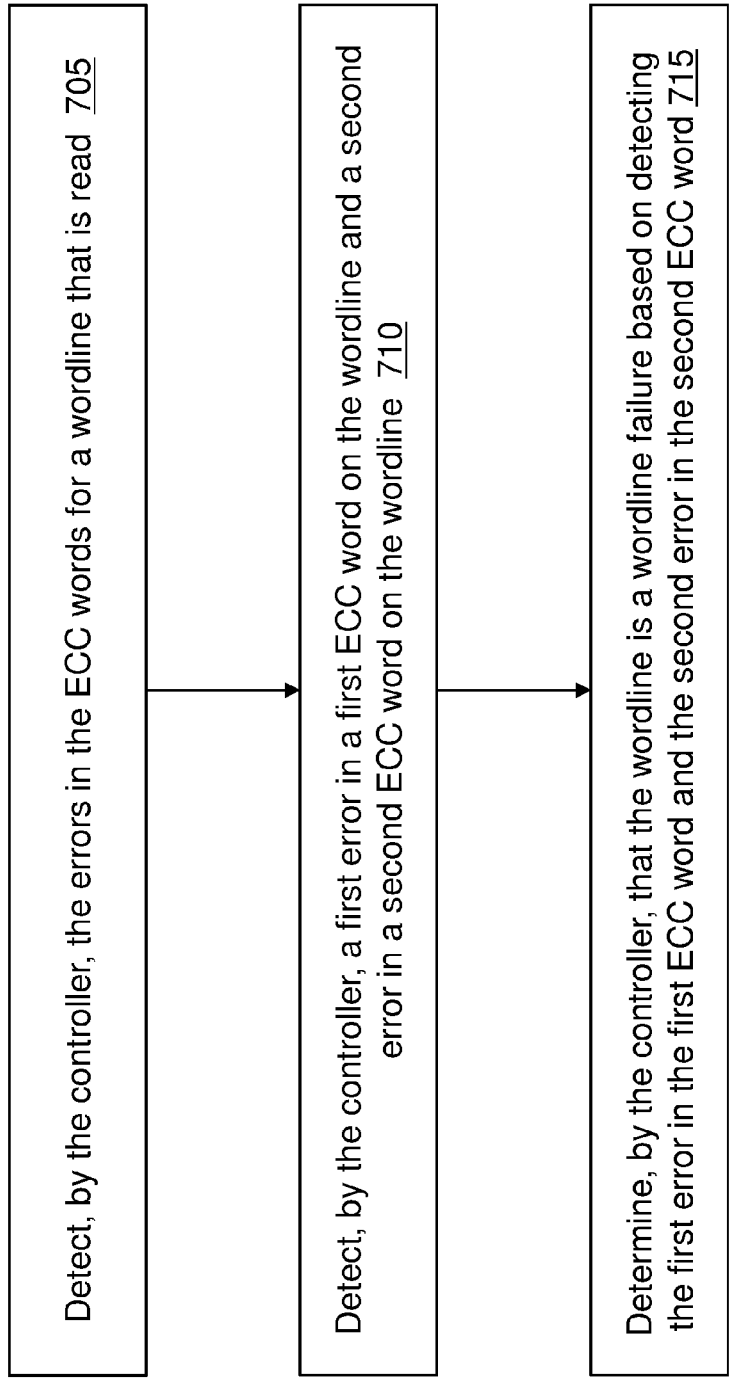
FIG. 7 depicts a flow chart of a method of a controller on a target wordline to find and process errors in accordance with an embodiment.

As discussed herein, FIG. 7 is a flow chart of a method 700 performed by the controller 60 on a target wordline (such as the wordline 240) to find and process errors and then determine a wordline failure according to an embodiment. Reference can be made to FIGS. 1-6 and their respective discussions.

The controller 60 is configured to detect the errors in the ECC words 310 for the (target) wordline 240 that is read at block 705. The controller 60 is configured to detect a first error in a first ECC word 310 (e.g., in ECC word 2) on the wordline 240 and a second error in a second ECC word 310 (e.g., in ECC word 6 corresponding to bitline 6 out of the 8 bitlines 225 in a subarray 220) on the wordline 240 at block 710. The controller 60 is configured to determine that the wordline 240 is a wordline failure based on detecting the first error in the first ECC word 310 and the second error in the second ECC word 310 at block 715.

Figure 8:
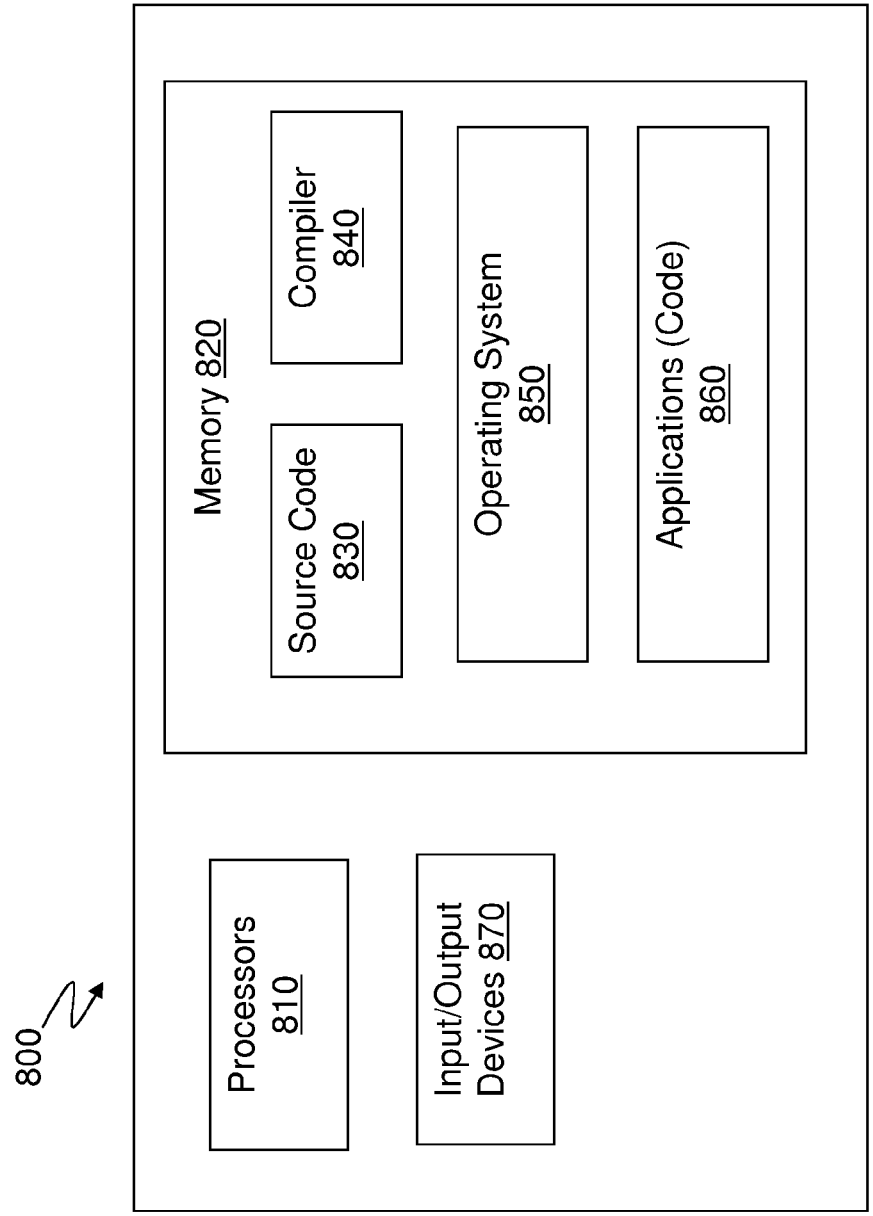
FIG. 8 illustrates an example of a computer having capabilities, which may be included and utilized in embodiments.

FIG. 8 illustrates an example of a computer 800 (e.g., as part of the computer system) having capabilities, which may be included in exemplary embodiments. Various methods, procedures, modules, flow diagrams, tools, applications, circuits, elements, and techniques discussed herein may also incorporate and/or utilize the capabilities of the computer 800. Moreover, capabilities of the computer 800 may be utilized to implement features of exemplary embodiments discussed herein. One or more of the capabilities of the computer 800 may be utilized to implement, incorporate, to connect to, and/or to support any element discussed herein (as understood by one skilled in the art) in FIGS. 1-7 and 9.

Generally, in terms of hardware architecture, the computer 800 may include one or more processors 810, computer readable storage memory 820, and one or more input and/or output (I/O) devices 870 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 810 is a hardware device for executing software that can be stored in the memory 820. The processor 810 can be virtually any custom made or commercially available processor, a central processing unit (CPU), a data signal processor (DSP), or an auxiliary processor among several processors associated with the computer 800, and the processor 810 may be a semiconductor based microprocessor (in the form of a microchip) or a microprocessor. Note that the memory 820 can have a distributed architecture, where various components are situated remote from one another, but can be accessed by the processor 810.

The software in the computer readable memory 820 may include one or more separate programs, each of which comprises an ordered listing of executable instructions for implementing logical functions. The software in the memory 820 includes a suitable operating system (O/S) 850, compiler 840, source code 830, and one or more applications 860 of the exemplary embodiments. As illustrated, the application 860 comprises numerous functional components for implementing the features, processes, methods, functions, and operations of the exemplary embodiments. The application 860 of the computer 800 may represent numerous applications, agents, software components, modules, interfaces, controllers, etc., as discussed herein but the application 860 is not meant to be a limitation.

The operating system 850 may control the execution of other computer programs, and provides scheduling, input-output control, file and data management, memory management, and communication control and related services.

The application 860 may be a source program, executable program (object code), script, or any other entity comprising a set of instructions to be performed. When a source program, then the program is usually translated via a compiler (such as the compiler 840), assembler, interpreter, or the like, which may or may not be included within the memory 820, so as to operate properly in connection with the 0/S 850. Furthermore, the application 860 can be written as (a) an object oriented programming language, which has classes of data and methods, or (b) a procedure programming language, which has routines, subroutines, and/or functions.

The I/O devices 870 may include input devices (or peripherals) such as, for example but not limited to, a mouse, keyboard, scanner, microphone, camera, etc. Furthermore, the I/O devices 870 may also include output devices (or peripherals), for example but not limited to, a printer, display, etc. Finally, the I/O devices 870 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 870 also include components for communicating over various networks, such as the Internet or an intranet. The I/O devices 870 may be connected to and/or communicate with the processor 810 utilizing Bluetooth connections and cables (via, e.g., Universal Serial Bus (USB) ports, serial ports, parallel ports, FireWire, HDMI (High-Definition Multimedia Interface), PCIe, InfiniBand®, or proprietary interfaces, etc.).

When the computer 800 is in operation, the processor 810 is configured to execute software stored within the memory 820, to communicate data to and from the memory 820, and to generally control operations of the computer 800 pursuant to the software. The application 860 and the O/S 850 are read, in whole or in part, by the processor 810, perhaps buffered within the processor 810, and then executed.

When the application 860 is implemented in software it should be noted that the application 860 can be stored on virtually any computer readable storage medium for use by or in connection with any computer related system or method.

The application 860 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 860 is implemented in hardware, the application 860 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 800 includes non-limiting examples of software and hardware components that may be included in various devices, servers, and systems discussed herein, and it is understood that additional software and hardware components may be included in the various devices and systems discussed in exemplary embodiments.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 9:
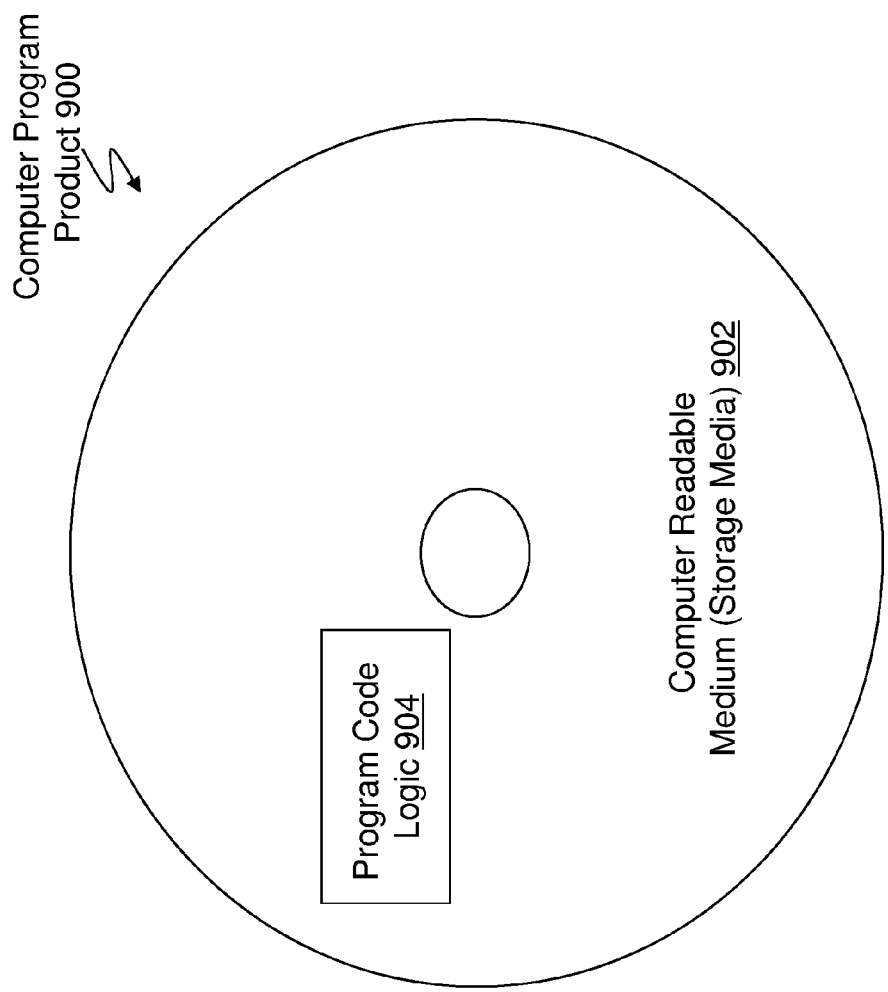
FIG. 9 illustrates a computer program product in accordance with an embodiment.

Referring now to FIG. 9, in one example, a computer program product 900 includes, for instance, one or more storage media 902, wherein the media may be tangible and/or non-transitory, to store computer readable program code means or logic 904 thereon to provide and facilitate one or more aspects of embodiments described herein.

Program code, when created and stored on a tangible medium (including but not limited to electronic memory modules (RAM), flash memory, Compact Discs (CDs), DVDs, Magnetic Tape and the like is often referred to as a "computer program product". The computer program product medium is typically readable by a processing circuit preferably in a computer system for execution by the processing circuit. Such program code may be created using a compiler or assembler for example, to assemble instructions, that, when executed perform aspects of the invention.

Embodiments include a method, system, and computer program product for error detection. Multiple error correcting code (ECC) words of an individual wordline are read from the cache. The wordline includes two or more ECC words which are read. The controller detects a first error in a first ECC word and a second error in a second ECC word in the wordline that is read. The controller identifies the wordline as a failing wordline based on detecting the first error in the first ECC word and the second error in the second ECC word.

In an embodiment, the method further includes determining that the first error is a first correctable error in the first ECC word and that the second error is a second correctable error in the second ECC word for the wordline that is read and determining, by the controller, that the wordline is the wordline failure based on finding the first correctable error in the first ECC word and the second correctable error in the second ECC word.

The method further includes treating a combination of the first correctable error in the first ECC word and the second correctable error in the second ECC word as an uncorrectable error for the wordline.

The method further includes determining that the first error is an uncorrectable error in the first ECC word or that the second error is the uncorrectable error in the second ECC word for the wordline that is read; and determining that the wordline is the wordline failure based on either the first error being the uncorrectable error in the first ECC word or the second error being the uncorrectable error in the second ECC word for the wordline that is read.

The method further includes at least one of: determining that the first error is a correctable error in the first ECC word and that the second error is an uncorrectable error in the second ECC word for the wordline that is read, and determining that the wordline is the wordline failure based on the first error being the correctable error in the first ECC word and the second error being the uncorrectable error in the second ECC word for the wordline that is read; and determining that the first error is the uncorrectable error in the first ECC word and that the second error is the correctable error in the second ECC word for the wordline that is read, and determining that the wordline is the wordline failure based on the first error being the uncorrectable error in the first ECC word and the second error being the correctable error in the second ECC word for the wordline that is read.

The method further includes determining that the first error is a first uncorrectable error in the first ECC word and that the second error is a second uncorrectable error in the second ECC word for the wordline that is read; and determining that the wordline is the wordline failure based on the first error being the first uncorrectable error in the first ECC word and the second error being the second uncorrectable error in the second ECC word for the wordline that is read.

The method further includes marking the wordline as the wordline failure, where the marking prevents the wordline from being utilized.

The method further includes initiating a call home action for repair of the wordline with the wordline failure; saving an address of the wordline to prevent the wordline from being utilized; and treating subsequent reference to the address of the wordline as an uncorrectable error.

Technical effects and benefits include a controller (e.g., circuit) that utilizes checking of multiple ECC words accessed with the same wordline (or subarray or other common regions of logic or arrays) to detect gross errors with a higher degree of detection.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of embodiments have been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles and the practical application, and to enable others of ordinary skill in the art to understand the embodiments with various modifications as are suited to the particular use contemplated.

Computer program code for carrying out operations for aspects of the embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described above with reference to flowchart illustrations and/or schematic diagrams of methods, apparatus (systems) and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer system, comprising:
a controller and a cache, the computer system configured to perform a method comprising:

reading multiple error correcting code (ECC) words of an individual wordline from the cache, the wordline comprising two or more ECC words which are read;

detecting, by the controller, a first error in a first ECC word and a second error in a second ECC word in the wordline that is read;

identifying, by the controller, the wordline as a failing wordline based on detecting the first error in the first ECC word and the second error in the second ECC word;

determining that the first error is a first correctable error in the first ECC word and that the second error is a second correctable error in the second ECC word for the wordline that is read; and determining, by the controller, that the wordline fails based on the determining that the first error is the first correctable error in the first ECC word and that the second error is the second correctable error in the second ECC word.

2. The computer system of claim 1, wherein the method further comprises treating a combination of the first correctable error in the first ECC word and the second correctable error in the second ECC word as an uncorrectable error for the wordline.

3. The computer system of claim 1, wherein the method further comprises determining that the first error is an uncorrectable error in the first ECC word or that the second error is the uncorrectable error in the second ECC word for the wordline that is read; and determining that the wordline fails based on either the first error being the uncorrectable error in the first ECC word or the second error being the uncorrectable error in the second ECC word.

4. The computer system of claim 1, wherein the method further comprises at least one of:

determining that the first error is a correctable error in the first ECC word and that the second error is an uncorrectable error in the second ECC word for the wordline that is read; and determining that the wordline fails based on the first error being the correctable error in the first ECC word and the second error being the uncorrectable error in the second ECC word; and determining that the first error is the uncorrectable error in the first ECC word and that the second error is the correctable error in the second ECC word for the wordline that is read; and determining that the wordline fails based on the first error being the uncorrectable error in the first ECC word and the second error being the correctable error in the second ECC word.

5. The computer system of claim 1, wherein the method further comprises determining that the first error is a first uncorrectable error in the first ECC word and that the second error is a second uncorrectable error in the second ECC word for the wordline that is read; and determining that the wordline fails based on the first error being the first uncorrectable error in the first ECC word and the second error being the second uncorrectable error in the second ECC word.

6. The computer system of claim 1, wherein the method further comprises marking the wordline as the failing wordline, the marking prevents the wordline from being utilized.

7. The computer system of claim 1, wherein the method further comprises initiating a call home action for repair of the failing wordline;

saving an address of the failing wordline to prevent the wordline from being utilized; and treating subsequent reference to the address of the failing wordline as an uncorrectable error.

8. A computer program product for a cache, the computer program product comprising:

a non-transitory computer readable storage medium readable by a processing circuit and storing instructions for execution by the processing circuit for performing a method comprising:

reading multiple error correcting code (ECC) words of an individual wordline from the cache, the wordline comprising two or more ECC words which are read;

detecting, by a controller, a first error in a first ECC word and a second error in a second ECC word in the wordline that is read; and identifying, by the controller, the wordline as a failing wordline based on detecting the first error in the first ECC word and the second error in the second ECC word;

determining that the first error is a first correctable error in the first ECC word and that the second error is a second correctable error in the second ECC word for the wordline that is read; and determining, by the controller, that the wordline fails based on the determining that the first error is the first correctable error in the first ECC word and that the second error is the second correctable error in the second ECC word.

9. The computer program product of claim 8, further comprising treating a combination of the first correctable error in the first ECC word and the second correctable error in the second ECC word as an uncorrectable error for the wordline.

10. The computer program product of claim 8, further comprising determining that the first error is an uncorrectable error in the first ECC word or that the second error is the uncorrectable error in the second ECC word for the wordline that is read; and determining that the wordline fails based on either the first error being the uncorrectable error in the first ECC word or the second error being the uncorrectable error in the second ECC word.

11. The computer program product of claim 8, further comprising at least one of:

determining that the first error is a correctable error in the first ECC word and that the second error is an uncorrectable error in the second ECC word for the wordline that is read; and determining that the wordline fails based on the first error being the correctable error in the first ECC word and the second error being the uncorrectable error in the second ECC word; and determining that the first error is the uncorrectable error in the first ECC word and that the second error is the correctable error in the second ECC word for the wordline that is read; and determining that the wordline fails based on the first error being the uncorrectable error in the first ECC word and the second error being the correctable error in the second ECC word.

* * * * *